United States Patent [19]  [11]  4,294,910
Wielinga  [45]  Oct. 13, 1981

[54] PRINTING PLATES

[75] Inventor: Hans Wielinga, Hilversum, Netherlands

[73] Assignee: Vickers Limited, London, England

[21] Appl. No.: 177,283

[22] Filed: Aug. 11, 1980

Related U.S. Application Data

[63] Continuation of Ser. No. 781,102, Mar. 25, 1977, abandoned, which is a continuation of Ser. No. 593,697, Jul. 7, 1975, abandoned.

[30] Foreign Application Priority Data

Jul. 8, 1974 [GB] United Kingdom ............... 30264/74

[51] Int. Cl.³ ........................... G03F 7/02; G03C 5/00
[52] U.S. Cl. ...................................... 430/302; 430/311
[58] Field of Search ...................... 96/49, 33, 36, 36.2, 96/36.1, 35.1, 91 D, 115 R, 86 P; 430/302, 311, 319

[56] References Cited

U.S. PATENT DOCUMENTS 2,958,599  11/1960  Neugebauer .
3,471,289  10/1969  Herrick .
3,482,977  12/1969  Baker .
3,573,975   4/1971  Dhaka et al. .
3,586,554   6/1971  Couture et al. .
3,615,937  10/1971  Collins et al. .
3,637,384   1/1972  Deutsch et al. .
3,652,273   3/1972  Htoo .
3,705,055  12/1972  Christensen et al. .
3,707,373  12/1972  Martinson et al. .
3,860,426   1/1975  Cunningham et al. .

FOREIGN PATENT DOCUMENTS 275916   3/1966  Australia .
843512   6/1976  Belgium .
2625336  12/1976  Fed. Rep. of Germany .
1154749   6/1969  United Kingdom .

OTHER PUBLICATIONS

Arcus et al., IBM Technical Disclosure Bulletin, vol. 15, No. 11, 4/1973, p. 353T.

*Primary Examiner*—Won H. Louie, Jr.
*Attorney, Agent, or Firm*—Kenyon & Kenyon

[57] ABSTRACT

A method of treating a plate comprising a substrate carrying an image includes the step of providing a shield on the plate prior to heating the plate so as to prevent contaminants contacting the plate during the heating step. The plate may be a radiation sensitive plate which has been image-wise exposed and developed and which comprises a substrate coated with a radiation sensitive layer comprising for example a quinone diazide and a novolak resin. The radiation sensitive plate may be for the production of a lithographic printing plate and the shield may be in the form of, for example, a layer of a salt such as sodium dedecyl phenoxy benzene disulphonate.

11 Claims, No Drawings

PRINTING PLATES

This is a continuation of co-pending application Ser. No. 781,102, filed Mar. 25, 1977, now abandoned which in turn is a continuation of formerly co-pending application Ser. No. 593,697 filed July 7, 1975, now abandoned.

This invention relates to radiation sensitive plates suitable for use in the production of lithographic printing plates.

Such radiation sensitive plates consist of a substrate usually of aluminium which may be grained and/or anodised, or of zinc, magnesium, copper or steel or a combination such as a bimetal or laminate, and a layer of radiation sensitive material deposited on the substrate.

Image-wise exposing the radiation sensitive layer to actinic radiation through a transparency causes the solubility of the radiation-struck areas to change relative to that of the areas which have not been struck by radiation. By treating the image-wise exposed plate with a suitable devloper, the more soluble of the areas can be removed to reveal the underlying substrate and leave an image on the substrate constituted by the less soluble areas. The areas of the substrate revealed on development constitute the non-image areas.

The type of radiation sensitive materials known as photopolymer materials become less soluble after exposure to radiation and therefore a negative transparency is used in the exposure. In this case it is the non-radiation struck areas which are removed by development and the radiation struck areas which remain on the substrate to form the image. Other materials which behave similarly are well known, e.g. the diazo resins, chromium sensitised colloids, diazonium or azide sensitised resins or polymers bearing such groups. Plates having a radiation sensitive layer based on such materials are known as negative-working plates.

Radiation sensitive materials such as those based on orthoquinone diazides become more soluble after exposure to radiation and therefore a positive transparency is used in the exposure. In this case it is the radiation struck areas which are removed by development and the non-radiation struck areas which remain on the substrate to form the image. Plates having such radiation sensitive layers are known as positive-working plates.

The life, in terms of the number of copies it can produce, of a printing plate can often be increased by heating ("burning-in") the image areas, provided of course, that the material of the image areas is suitable and "burning-in" is a well established practice in the art of producing lithographic printing plates from radiation sensitive plates. As early disclosure of the burning-in of images based on napthoquinone diazides is contained in British Patent Specification No. 699,412. In accordance with the teachings in this patent specification, a radiation sensitive plate including a layer of napthoquinone diazide is image-wise exposed, developed with an alkaline solution to selectively remove those areas of the layer which were struck by radiation during the exposure, and then placed in an oven to heat the image constituted by those areas of the layer which were not struck by radiation. Subsequently, it is necessary to treat the plate with an alkaline solution again in order to remove contaminating residues from the plate and make the plate ready for printing.

In many cases, the image areas to be heated may be reinforced by incorporating reinforcing material in the radiation sensitive layer and/or by applying the reinforcing material to the image areas after development as a reinforcing lacquer. Novolak resins and/or resol resins are commonly used as reinforcing material. However, as disclosed in British Patent Specification No. 1,154,749, heating at a temperature sufficient to harden resin reinforced image areas causes those areas of the substrate revealed on development to be at least partially covered with a contaminating layer which is ink accepting and which would, therefore, cause scumming and yield a soiled background during printing. This layer must therefore be removed before printing is started and this is achieved in accordance with British Patent Specification No. 1,154,749 by treating the plate with aqueous alkaline solution.

The contaminating layer produced on heating is not, as a rule, discernible to the naked eye and it is difficult to be sure that all the contamination has been removed. Moreover, when the substrate surface is porous, as is the case when the substrate is anodised aluminium, the contamination may be present in the pores. Whilst such contamination would probably not cause scumming immediately, it could cause scumming during a long printing run as the substrate surface is abraded away. Further, the necessity of having to effectively redevelop the plates after heating in order to remove the contaminating layer is inconvenient in that this means that the plates have to be returned to the plate-making room after they have been removed from the oven.

Because of these disadvantages of conventional "burning-in" procedures, we have carried out investigations into the source of the contamination with a view to preventing the same occuring. It has been found that the contamination apparently arises as a result of some component of the image material subliming from the image areas during heating and subsequently being deposited on areas of the substrate revealed on development. Even plates which include no material which could give rise to the contaminating material have been found to become contaminated by deposition thereon of contaminating material already deposited on the internal surfaces of the burning-in oven as a result of previous use of the oven for burning-in. The component giving rise to the contamination may emanate from the radiation sensitive material of the layer or from a novolak or other resin in the layer or it may be an impurity e.g. a phenol present in the layer.

It is an object of the present invention to avoid the non-image areas becoming contaminated during burning-in, and thus obviate the necessity for cleaning.

According to the present invention there is provided, in a method of treating a plate comprising a substrate carrying an image which method comprises the step of heating the plate, the improvement which comprises providing a shield on the plate prior to the heating step so as to prevent contaminants contacting the plate during the heating step.

In a particularly preferred embodiment of the invention, the plate is an image-wise exposed and developed radiation sensitive plate. Thus the invention particularly, but not exclusively, provides a method of processing a radiation sensitive plate comprising a substrate coated with a radiation sensitive layer which method comprises:

(i) image-wise exposing the layer to radiation so that the layer includes radiation struck areas and non-radiation struck areas of differing solubility;

(ii) developing the image-wise exposed layer selectively to remove the more soluble of the areas and reveal the substrate underlying those areas;

(iii) providing a shield on the revealed substrate to prevent contaminants contacting the same;

(iv) heating the less soluble of the areas remaining on the substrate after development; and (v) removing the shield.

Whilst the invention relates mainly to the processing of radiation sensitive plates to form lithographic printing plates, it is also applicable to the processing of radiation sensitive plates in the preparation of printed circuits and integrated circuits and similar products where the radiation sensitive material is ultimately used as a photoresist which needs to be heated before an etching step is undertaken and where the presence of the contamination could interfere with the etching.

In a particularly preferred embodiment the shield is produced by treating the plate with a maskant in liquid form so as to form a layer of maskant over the plate. The maskant is preferably a water soluble salt applied to the plate as an aqueous solution so that a shield in the form of a salt film is formed on the plate. The salt may be, for example, a sodium dodecyl phenoxy benzene disulphonate, a sodium salt of alkylated naphthalene sulphonic acid, a disodium salt of methylene dinaphthalene sulphonic acid, a sodium dodecyl benzene sulphonate, a sodium salt of sulphonated alkyldiphenyl oxide or lithium nitrate.

The maskant should be such that it does not volatilise at the heating temperature and is selected according to the nature of the substrate, the nature of the radiation sensitive layer, and the purpose for which the radiation sensitive plate is to be used. For example, in the case where a lithographic printing plate is being produced, the maskant as well as being an effective physical barrier to the contaminating material must also be such that it does not deleteriously affect either the image (e.g. by dissolving it or rendering it non-ink receptive (or the non-image areas (e.g. by rendering them ink-receptive). Also it must be readily removeable after the "burning-in" without the image and non-image areas being deleteriously affected. The foregoing examples of salts are particularly useful for use in the production of lithographic printing plates. Shields formed from such salts do not deleteriously affect the lithographic properties of the image and non-image areas. Indeed, such shields can be readily removed from the plate merely by wiping the plate with water. This can be effected whilst the plate is actually mounted on the printing press. Thus, after having been subjected to the burning-in step, the plate can be mounted directly on the printing press without being returned to the plate-making room. Rinsing with water to remove the shield and desensitising with, e.g. gum arabic, is all that is then required to make the plate ready for printing.

The following Examples illustrate the invention.

EXAMPLE 1

Four Alympic positive-working, presensitised plates (denoted by references A to D) as supplied by the Howson-Algraphy Group of Vickers Limited and which have radiation sensitive layers comprising an orthoquinone diazide and a novolak resin were exposed under positive transparencies and developed with alkaline developer. Plate A was desensitised with gum arabic in the usual way, inked up and used in an accelerated wear test to give an estimated 70,000 good copies. Plate B was heated after development, in an oven at 250° C. for ten minutes. It was then cooled and treated as Plate A. The non-image areas of the plate were found to accept ink easily as a result of contamination during the heating step. Plate C was treated as Plate B but after the heating was again thoroughly rubbed with alkaline developer to clean the non-image areas in the manner taught by British Specification No. 1,154,749. This plate, which is illustrative of a plate of the prior art, gave an estimated 150,000 good copies. In the case of Plate D, the positive transparency was in the form of a non-transparent area having a circular transparent area therein. Thus the developed plate included a circular non-image area. This plate was heated in the same way as Plates B and C except that a metal disc of smaller diameter than the non-image area was positioned in the centre of the non-image area. When the plate was inked it was found that the circular non-image area accepted ink to a marked degree except in that region where it had been covered by the metal disc. It was clear from the test on Plate D that contaminating material had been deposited on the non-image areas during heating and that this contamination can be prevented by shielding the non-image areas.

Whilst solid preformed shields can be used in cases where the non-image areas are of simple shape, such shields would have to be excessively complicated in other cases.

EXAMPLE 2

An Alympic plate was exposed and developed in the same way as the plates in Example 1. The plate was then rinsed and wiped uniformly with a 45% solution of sodium dodecyl phenoxy benzene disulphonate to form a layer of that salt on the plate. The plate was heated for ten minutes at 250° C., cooled, washed with water to remove the salt layer, desensitised and inked. There was no acceptance of ink on the non-image areas of the plate and the plate gave an estimated 150,000 good copies.

EXAMPLE 3

Example 2 was repeated except that the plate was wiped with a solution of a sodium salt of an alkylated naphthalene sulphonic acid and heated at 200° C. for 15 minutes. There was no acceptance of ink on the non-image areas and the plate gave an estimated 100,000 good copies.

EXAMPLE 4

An Alympic Gold positive working presensitised printing plate (Vickers Limited, Howson-Algraphy Group) was exposed under a positive transparency and developed with strongly alkaline developer, rinsed with water and contacted with a 45% solution of a sodium salt of sulphonated alkyldiphenyl oxide to form a thin layer of that salt thereon. The plate was then heated in an electric oven at 230° C. for 8 minutes, cooled, washed with water to remove the layer, desensitised and inked. There was no acceptance of ink on the non-image areas and the plate gave an estimated 100,000 good copies on a heat-set web offset printing machine. An identical plate which had not been treated with the salt solution scummed badly as soon as printing commenced. Vigorous cleaning prior to printing was necessary to prevent this scumming.

EXAMPLE 5

A mechanically grained P4 presensitised positive-working plate as supplied by Kalle AG was exposed through a positive transparency and developed with alkaline developer. After rinsing it was wiped with a 25% solution of the disodium salt of methylene dinaphthalene sulphonic acid and wiped dry thereby forming a layer of that salt on the plate. The plate was then heated at 180° C. for 20 minutes rinsed, desensitised and inked. There was no acceptance of ink on the non-image areas and the plate gave an estimated 50,000 good copies.

EXAMPLE 6

Example 2 was repeated except that the plate was wiped with a 25% aqueous solution of sodium dodecyl benzene sulphonate. Heating was carried out at 230° C. for 10 minutes. Considerable difficulty was experienced in getting the image areas to accept ink but eventually the plate gave an estimated 150,000 good copies.

EXAMPLE 7

Example 2 was repeated except that the plate was wiped with a 20% solution of hydrated lithium nitrate and was heated at 200° C. for ten minutes. There was no acceptance of ink on the non-image areas and the plate gave an estimated 100,000 good copies.

EXAMPLE 8

A presensitised negative working plate comprising a grained sulphuric acid anodised aluminium substrate was coated with a polyvinyl cinnamate based material known as Kodak Photo Resist to form a layer of 0.5 g/m². The plate was exposed beneath a negative and developed with 2 methoxyethyl acetate containing a small percentage of desensitising acid together with 15% surfactant. After development, the plate was rinsed clean and whilst still moist was treated with an emulsion reinforcing lacquer containing a novolak resin. The plate was washed and treated with a 45% aqueous solution of a sodium dodecyl phenoxy benzene disulphonate to produce a thin layer of that salt on the plate. The plate was then heated for ten minutes at 250° C., cooled, washed with water to remove the layer, desensitised with gum arabic and placed on a printing press. No difficulty was experienced in obtaining good clean copies.

EXAPLE 9

A sheet of photo-engraver's magnesium plate was cleaned and coated with aqueous poly(vinyl alcohol) which had been light-sensitised by the addition of 10% ammonium dichromate. The resultant radiation sensitive plate was exposed beneath a negative, developed with water and treated with dilute chromic acid to further cross-link the image material. Before the usual heating operation, a 45% aqueous solution of a sodium salt of sulphonated alkyldiphenyl oxide was applied to the plate and dried down. No de-scumming with acidic gum containing fluids was necessary before the plate could be satisfactorily etched in a powderless etching machine.

EXAMPLE 10

A plate was prepared by coating a grained, anodised aluminum substrate with a composition comprising 2 parts of 4,4' diazidodiphenylamine and 10 parts of novolak resin dissolved in 88 parts of butanene. The resultant radiation sensitive plate was then exposed through a negative and developed with an alkaline solution. After rinsing the plate, it was wiped with a 2.5% aqueous solution of a sodium salt of sulphonated alkyl diphenyl oxide and wiped dry to form a layer of that salt on the plate. The plate was then heated for 10 minutes at 250° C. After cooling, the plate was rinsed to remove the layer, desensitised and inked. There was no acceptance of ink on the non-image areas.

EXAMPLE 11

A grained and anodised aluminium substrate was coated with a proprietory light sensitive solution of dichromated polyvinyl alcohol and dried. The resultant radiation sensitive plate was exposed beneath a positive. The exposed plate was developed with water and dried. A printing image was formed by applying a thin layer of a resol/epoxy resin lacquer. After drying the lacquer, the plate was wiped over with a 45% aqueous solution of a sodium dodecyl phenoxy benzene disulphonate to form a layer of that salt on the plate. The plate was then heated at 200° C. for 2 minutes. The plate, when cool, was rinsed to remove the layer, desensitised and inked up. There was no acceptance of ink on the non-image areas during printing. An identical plate which was not treated with the salt solution before burning in had to be vigorously cleaned to prevent the non-image areas accepting ink.

EXAMPLE 12

A silver chloride photosensitive layer on baryta coated paper was exposed in a camera and the exposed negative and a suitable sheet of aluminium were then passed through a conventional apparatus used for the silver transfer process. The aluminium was separated from the negative and the surface thereof was desensitised with a customary fixing solution. Thereafter the image areas on the aluminium were evenly covered with a resol/epoxy resin reinforcing lacquer. The plate was completed by washing, drying, wiping with a 45% aqueous solution of a sodium dodecyl phenoxy benzene disulphonate to form a layer of that salt thereon, heating at 200° C. for 2 minutes, and washing to remove the layer. There was no acceptance of ink on the non-image areas during printing. An identical plate which was not treated with the salt solution had to be cleaned after the heating to prevent the non-image areas accepting ink.

EXAMPLE 13

Various proprietory plates, all of which are believed to include sensitive layers containing a novolak resin were exposed, developed and heated in accordance with the manufacturer's instructions. One sample of each was treated before heating, with a 45% aqueous solution of a sodium dodecyl phenoxy benzene disulphonate to form a layer of that salt thereon and one sample of each was cleaned after heating as instructed by the manufacturers or in accordance with the teachings in British Patent Specification No. 1,154,749. It was found that there was no difference in the performance of the plates.

The plates tested were as follows: Polychrome GAP; Enco P200; Rogers Posilith; Nicholson Instalith; Kalle P3, P4 P6 and P7; Ferrania F1 and Fuji SGP.

I claim:

1. A method of processing a pre-sensitized radiation sensitive plate which method comprises (i) image-wise exposing to radiation a pre-sensitized radiation sensitive plate, said plate being adapted for the manufacture of a lithographic printing plate or a printed circuit or an integrated circuit, and said plate comprising a metallic substrate and a radiation sensitive layer comprising an organic photosensitive compound, so that said radiation sensitive layer includes areas exposed to radiation and areas not exposed to radiation, said areas being of differing solubility and comprising a more-soluble area, (ii) thereafter developing the image-wise exposed radiation sensitive layer by selectively removing said layer from said more-soluble area and revealing the substrate underlying said more-soluble area, (iii) thereafter treating the plate with an aqueous solution to provide a water-soluble layer overlying the revealed substrate and the previously-exposed radiation sensitive layer not removed during said developing step, said water-soluble layer being formed by applying to said plate an aqueous solution of at least one water-soluble salt selected from the group consisting of a sodium dodecyl phenoxy benzene disulphonate, a sodium salt of an alkylated naphthalene sulphonic acid, a disodium salt of methylene dinaphthalene sulphonic acid, a sodium salt of a sulphonated alkyldiphenyl oxide, a sodium dodecyl benzene sulphonate, lithium nitrate, and mixtures thereof, (iv) thereafter burning-in said plate to adapt said plate for lithographic printing, or printed circuit or integrated circuit said burning-in being conducted in the presence of scum-forming contaminants, and (v) removing said water-soluble layer from said plate with water, thereby removing scum-forming contaminants from the area of the revealed substrate of said plate.

2. A method according to claim 1 wherein said scum-forming contaminants emanate from a constitutent incorporated into said radiation sensitive layer prior to said image-wise exposing step, or a reinforcing lacquer applied after said developing step and prior to forming said layer of a water-soluble salt, or from the internal surface of the apparatus employed in said burning-in step.

3. A method according to claim 1 wherein said scum-forming contaminants emanate from a constituent incorporated in the radiation sensitive layer prior to the image-wise exposing step.

4. A method according to claim 1 wherein said scum-forming contaminants emanate from a resinous reinforcing lacquer applied to the plate after the exposing and developing steps and prior to the step of providing a water-soluble layer on the plate.

5. A method accoriding to claim 1 wherein said scum-forming contaminants emanate from the internal surface of the apparatus employed in said burning-in step.

6. A method according to claim 1, wherein said water-soluble salt comprises a disodium salt of methylene dinaphthalene sulfonic acid.

7. A method according to claim 1, wherein said water-soluble salt comprises a sodium dodecyl phenoxy benzene disulfonate.

8. A method according to claim 1, wherein said water-soluble salt comprises a sodium salt of an alkylated naphthalene sulfonic acid.

9. A method according to claim 1, wherein said water-soluble salt comprises a sodium salt of a sulfonated alkyldiphenyl oxide.

10. A method according to claim 1, wherein said water-soluble salt comprises a sodium dodecyl benzene sulfonate.

11. The process of claim 1 whereby removing said water-soluble layer in step (v) is effected while said plate is mounted on a printing press.

* * * * *